United States Patent
Lee et al.

[11] Patent Number: 5,693,548
[45] Date of Patent: Dec. 2, 1997

[54] METHOD FOR MAKING T-GATE OF FIELD EFFECT TRANSISTOR

[75] Inventors: Jin-Hee Lee; Sang-Soo Choi; Hyung-Sup Youn; Chul-Soon Park; Hyung-Jun Yoo; Hyung-Moo Park, all of Daejeon, Rep. of Korea

[73] Assignee: Electronics and Telecommunications Research Institute, Daejeon, Rep. of Korea

[21] Appl. No.: 359,197

[22] Filed: Dec. 19, 1994

[51] Int. Cl.[6] .................................. H01L 21/265
[52] U.S. Cl. ............... 437/41; 437/39; 437/175; 437/912; 437/944; 148/DIG. 100; 148/DIG. 140
[58] Field of Search ................. 437/39, 40, 41, 437/228, 175, 912, 944; 148/DIG. 3, DIG. 100, DIG. 140

[56] References Cited

U.S. PATENT DOCUMENTS

| | | | |
|---|---|---|---|
| 4,283,483 | 8/1981 | Coane | 430/296 |
| 4,700,462 | 10/1987 | Beaubien et al. | 437/187 |
| 5,006,478 | 4/1991 | Kobayashi et al. | 148/DIG. 100 |
| 5,185,277 | 2/1993 | Tung et al. | 437/912 |
| 5,240,878 | 8/1993 | Fitzsimmons et al. | 148/DIG. 100 |
| 5,288,654 | 2/1994 | Kasai et al. | 437/944 |
| 5,288,660 | 2/1994 | Hua et al. | 437/912 |
| 5,432,125 | 7/1995 | Misawa et al. | 437/944 |
| 5,445,979 | 8/1995 | Hirano | 437/912 |

FOREIGN PATENT DOCUMENTS

| | | | |
|---|---|---|---|
| 0103343 | 7/1984 | Japan | 437/944 |
| 0228622 | 10/1986 | Japan | 437/944 |
| 0251722 | 10/1989 | Japan | 437/944 |
| 0173137 | 7/1991 | Japan | 437/39 |
| 405136018 | 6/1993 | Japan | 437/944 |
| 1184958 | 7/1989 | Jordan | 437/944 |
| 8902652 | 3/1989 | WIPO | 437/39 |

*Primary Examiner*—Jey Tsai
*Assistant Examiner*—Long Pham
*Attorney, Agent, or Firm*—Antonelli, Terry, Stout & Kraus, LLP.

[57] ABSTRACT

A method for making a T-shaped gate of a field effect transistor is disclosed. The method includes the steps of sequentially depositing first and second photoresist layers on a semiconductor substrate and performing an exposure using electron beams having different energy, one of the electron beams having a first energy to lightly expose only the second photoresist layer and the other of the electron beams having a second energy to lightly expose all of the first and second layers. The invention reduces gate resistance and parasitic capacitance of the T-shaped gate.

24 Claims, 2 Drawing Sheets

METHOD FOR MAKING T-GATE OF FIELD EFFECT TRANSISTOR

BACKGROUND OF THE INVENTION

1. Field of the Invention

The present invention relates to fabrication of a field effect transistor, and more particularly to a method for making a gate of a field effect transistor (hereinafter, referred to as "FET").

2. Description of the Prior Art

Generally, in fabrication of a semiconductor device, it is extremely difficult to form a fine pattern of a submicrometer dimension or less using a well-known optical stepper technique in the art.

In addition, to overcome a limitation of such an optical stepper, several techniques, such as a technique for reducing a wavelength of a stepper light source by an exciter laser, a technique using a phase inversion mask, a technique for reducing a pattern size by a dry-etching, etching using an X-ray source, and a direct writing technique using an electron beam as a light beam or the like, have been used.

The above-mentioned techniques all allow further fine patterns to be formed on a substrate, as compared to the optical stepper technique.

However, none of the prior art techniques can be used to obtain a pattern of 0.2 μm or less. Particularly, by the direct writing technique, it is extremely difficult to make a mask. To form a pattern of 0.2 μm or less, however, the direct writing technique of the prior art techniques is mainly used.

In a Japanese Patent Open-Laid No. 2-266535, it is disclosed that an exposure process is performed two times and a metal etching process is carried out to form a T-gate on a substrate. By this method, the resistance of a T-gate can be reduced, but it is difficult to perform a metal etching process.

In U.S. Pat. No. 4,700,462, it is disclosed that, after formation of an oxide layer on a substrate, the oxide layer is etched back by an RIE (reactive ion etching) using a photoresist pattern formed thereon, and then an undercutting layer is formed thereon before performing deposition of a metal, thereby allowing a T-gate to be formed thereon. With this method, it is easy to form a fine pattern, but it is difficult to etch the oxide layer. The width of an upper portion of the T-gate, is not relatively greater than that of a lower portion thereof. Thus, in a semiconductor device necessary for a fine T-gate, since the gate resistance and the parasitic capacitance are increased inversely in proportion to the width of a fine gate, this method is not preferably to use where gate resistance and parasitic capacitance are a concern.

To solve the gate resistance and the parasitic capacitance of a gate, change in shape of a gate is attempted in the art (see L. D. Nguyen, et al., "Design, Fabrication, and Characterization of Ultra High Speed AlGaAs/InGaAs MOSFET's", IEDM Tech. Dig., December 1988, pp. 176–179, and see Chao, et al., "Electron Beam Fabrication of Quarter-Micron T-shaped Gate FETs using a New Tri-Layer Resist System", IEDM Tech., Dig., December 1983, pp. 613–616).

FIGS. 1A and 1B are cross-sectional views showing the steps of a method for fabricating a T-gate of a field effect transistor.

With reference to FIG. 1A, first, on a semi-insulating GaAs substrate, several layers, i.e. a two-dimensional electron gas layer 2, an AlGaAs layer 3 and a cap layer 4 are sequentially formed. Then, ohmic layers 5a, 5b are formed using a photomask, as shown in FIG. 1A.

In addition, as shown in FIG. 1A, a first photoresist layer a is deposited thereon and thermally annealed, and then a second photoresist layer 7 is deposited on the first photoresist layer 6. With electron beam lithography, the photoresist layers 6, 7 are selectively etched back to form a T-shaped pattern. Then, the exposure of the photoresist layers 6, 7 is performed using the uniform energy. A gate metal is coated by an electron beam deposition method and the layers formed on the cap layer 4 are removed. As a result, a T-gate is formed as shown in FIG. 1B.

In this method, since a gate resistance is determined by a sectional area the gate metal, there is a limitation in the reduction of gate resistance.

SUMMARY OF THE INVENTION

It is an object of the present invention to provide a method for making a T-shaped gate of a field effect transistor in which resistance and parasitic capacitance of the T-shaped gate can be significantly reduced, thereby allowing electrical performance of the transistor to be improved.

According to the aspect of the present invention, the method for making a T-shaped gate of a field effect transistor, comprises the steps of sequentially depositing first and second photoresist layers on a semiconductor substrate; and performing an exposure using electron beams having different energy, one of the electron beams having a first energy to lightly expose only the second photoresist layer and the other of the electron beams having a second energy to lightly expose all of the first and second layers.

According to another aspect of the present invention, the method for making a T-shaped field effect transistor, comprises the steps of sequentially forming a two dimensional electron gas layer, an AlGaAs layer and a cap layer on a semi-insulating substrate; forming an ohmic layer therein using a photomask; depositing a first photoresist layer of about 2000 Å in thickness on the cap layer and thermally annealing the first photoresist layer; depositing a second photoresist layer on the first photoresist layer; irradiating electron beams spaced from each other and having different energy toward the photoresist layers; developing the photoresist layers to form a T-shaped pattern; coating a metal layer; removing the first and second photoresist layers to form the T-shaped gate; and forming an insulating layer on the cap layer 4.

In this method, the step of developing the photoresist layers is performed in order that the second photoresist layer has an inverted sloped surface.

In the method, since only one direct writing process is performed, the fabrication sequence can be simplified, as compared to the prior art method necessary for several repeated exposures.

BRIEF DESCRIPTION OF THE DRAWINGS

This invention may be better understood and its object will become apparent to those skilled in the art by reference to the accompanying drawings as follows.

DESCRIPTION OF THE PREFERRED EMBODIMENT(S)

Figure 1A:
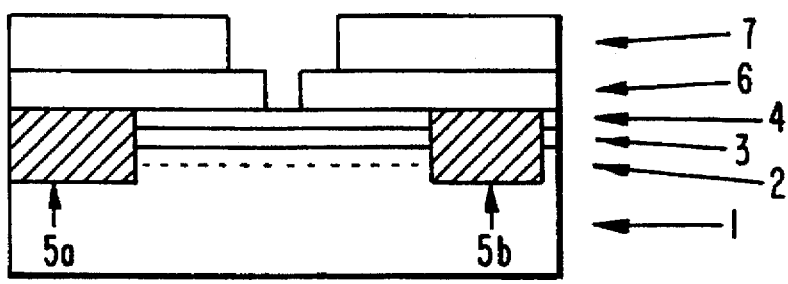
FIGS. 1A and 1B are cross-sectional views showing the steps of a prior art method for fabricating a T-gate of a field effect transistor.
Figure 1B:
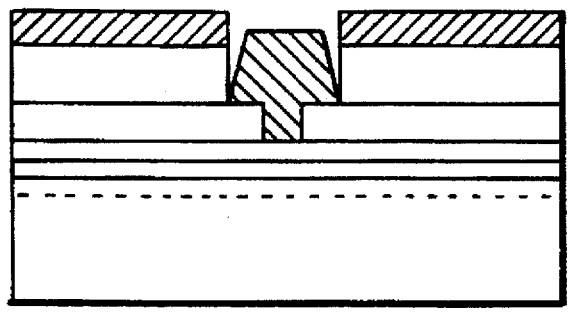

FIGS. 2A to 2E are cross-sectional views showing the steps of a method for making a T-shaped gate in accordance with the present invention. In FIGS. 2A to 2E, component elements having similar functions to the component elements used for explaining the prior art method (shown in FIGS. 1A and 1B) are indicated by the same reference numerals.

Figure 2A:
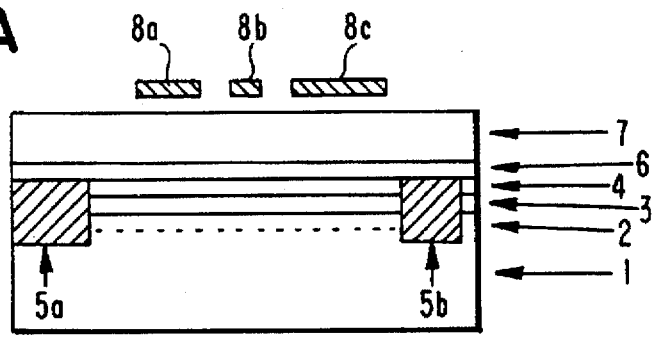
FIGS. 2A to 2E are cross-sectional views showing the steps of a method for making a T-shaped gate of a field effect transistor in accordance with the present invention.

Referring to FIG. 2A, on a semi-insulating GaAs substrate 4, several layers, i.e. a two-dimensional electron gas layer 2, an AlGaAs layer 3 and a doped Schottky cap layer 4 are sequentially formed, and then ohmic layers 5a, 5b are formed using a photomask.

Also, on the cap layer 4, a first photoresist layer 6 of about 2000 Å in thickness is deposited and thermal-annealed at the temperature of about 190°. The first photoresist layer 6 is composed of PMMA (polymethylmetacrylate).

Figure 2B:
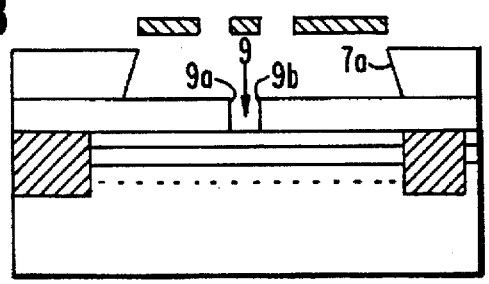
Figure 2C:
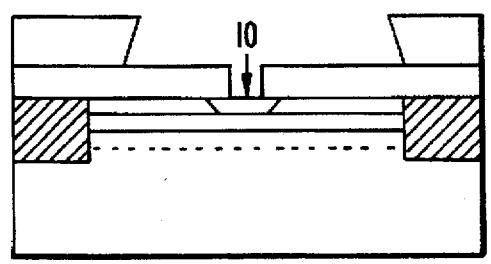

On the first photoresist layer 6, a second photoresist layer 7 also is deposited. The second photoresist layer 7 is composed of P(MMA-MMA). Next, an exposure using electron beams of a different energy is performed to form a T-shaped pattern in the photoresist layers 6 and 7, as shown in FIG. 2B.

While performing a pattern direct writing to form the T-shaped pattern therein, electron beams spatially separated and different from each other are used. Then, the T-shaped pattern formed by the pattern direct writing has an inverted sloped surface 7a, as shown in FIG. 2B.

In FIG. 2A, reference numerals 8a, 8b and 8c indicate first, second and third electron beams, respectively. It can be seen from FIG. 2A that two electron beams adjacent to each other are spaced and spatially separated from each other. The distance between the two adjacent electron beams can be changed in the range of from zero to several writing points, whereas one writing point is 0.025 μm. If energy of the electron beam is 30 KeV, it is preferably in this embodiment that the distance therebetween is set in the range of from one to three writing points.

To form the T-shaped pattern, each of the first and third electron beams 8a, 8c has an energy which lightly exposes only the second photoresist layer 7 and the second electron beam 8b has an energy sufficient enough to light expose all of the first and second photoresist layers 6, 7.

As described above, in the embodiment, if each energy of the electron beams is adequately controlled, several shapes of patterns can be obtained.

Even though a developing process is completed to form the T-shaped pattern, undeveloped photoresist layers 9, 9a, 9b remain therein, as shown in FIG. 2B. The undeveloped photoresist layers are removed by a dry-etching method using oxygen plasma to form the T-shaped pattern shown in FIG. 2C.

Figure 2D:
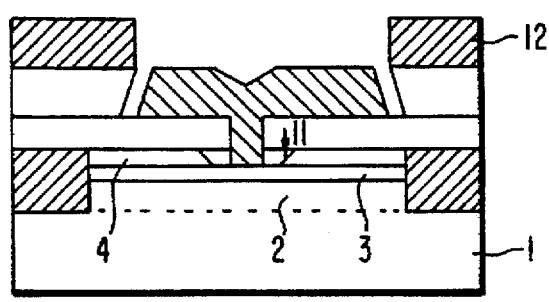

Next, as shown in FIG. 2D, the cap layer 4 is selectively recess-etched using the patterned photoresist layers as a mask, whereby a recess having a slope surface 11 of about 45" is formed in the cap layer 4, and then a gate metal layer is coated thereon.

Figure 2E:
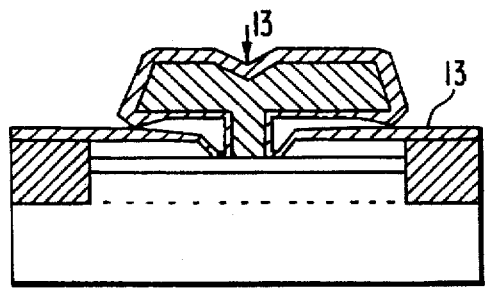

Subsequently, a lift-off is performed to remove the first and second photoresist layers 6, 7. As a result, a T-shaped gate is made as shown in FIG. 2E. To prevent the cap layer 4 from being oxidized, an insulating layer 13 is deposited thereon.

According to the method of the present invention, since a direct writing process by a data file is performed, the method is simplified in fabrication sequence and is economical, as compared to the prior art method necessary for several repeated exposures.

Additionally, because only one direct writing is performed to form a T-shaped gate, errors caused due to a change in energy or arrangement can be reduced.

Also, when a photoresist pattern is formed to form a T-shaped gate or a gamma-shaped gate, electrons having different energy are used, whereby width of an upper portion of the gate can be controlled. For this control, a gate resistance and a parasitic capacitance of the gate can be reduced.

Furthermore, the width of a lower portion of the gate is determined by a dry-etching, thereby a specified gate pattern can be obtained. Therefore, the line width of the gate is controlled.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

We claim:

1. A method for making a T-shaped gate of a field effect transistor, the method comprising the steps:

sequentially depositing first and second photoresist layers on a semiconductor substrate to form multiple layers comprising the first layer disposed on top of the semiconductor substrate and the second layer disposed on top of the first layer;

performing only a single electron beam exposure of portions of the first and second layers of the multiple layers using electron beams having different energy levels with one of the energy levels exposing only a portion of the second layer and another of the energy levels exposing another portion of the first and second layers; and wherein the electron beams are spatially separated from each other during imaging of the electron beams upon the second layer.

2. A method in accordance with claim 1 wherein:

the T-shaped gate has a base extending upward from the substrate and a top extending parallel to the substrate with the top having sides which are sloped outward from a top surface of the top to a bottom surface of the top which is longer than the top surface of the top; and the exposing of the first and second layers with the electron beams of different energy produces the sides which are sloped.

3. A method in accordance with claim 1 wherein:

the first photoresist layer has a thickness of about 2000 Å.

4. A method in accordance with claim 2 wherein:

the first photoresist layer has a thickness of about 2000 Å.

5. A method for making a T-shaped gate of a field effect transistor, the method comprising the steps sequentially forming a two-dimensional election gas layer, an AlGaAs layer and a cap layer on a semiconductor substrate;

forming an ohmic layer on the cap layer;

sequentially depositing first and second photoresist layers over a semiconductor substrate to form multiple layers comprising the first layer disposed on top of the semiconductor substrate and the second layer disposed on top of the first layer;

performing only a single electron beam exposure of portions of the first and second layers of the multiple layers using electron beams having different energy levels with one of the energy levels exposing only a portion of the second layer and another of the energy levels exposing another portion of the first and second layers with the electron beams being spatially separated from each other during imaging of the electron beams upon the second layer;

developing the first and second photoresist layers to form a T-shaped pattern;

coating a metal gate layer; and removing the first and second photoresist layers to form the T-shaped gate.

6. A method in accordance with claim 5 wherein:

the T-shaped gate has a base extending upward from the substrate and a top extending parallel to the substrate with the top having sides which are sloped outward from a top surface of the top to a bottom surface of the top which is longer than the top surface of the top; and the exposing of the first and second layers with the electron beams of different energy produces the sides which are sloped.

7. A method in accordance with claim 5 wherein:

the first photoresist layer has a thickness of about 2000 Å.

8. A method in accordance with claim 6 wherein:

the first photoresist layer has a thickness of about 2000 Å.

9. A method in accordance with claim 1 wherein:

a portion of the multiple layers is not exposed to either electron beams.

10. A method in accordance with claim 1 wherein:

the electron beams of energy levels respectively lightly expose the first and second photoresist layers.

11. A method in accordance with claim 2 wherein:

a portion of the multiple layers is not exposed to either electron beams.

12. A method in accordance with claim 2 wherein:

the electron beams of energy levels respectively lightly expose the first and second photoresist layers.

13. A method in accordance with claim 3 wherein:

a portion of the multiple layers is not exposed to either electron beams.

14. A method in accordance with claim 3 wherein:

the electron beams of energy levels respectively lightly expose the first and second photoresist layers.

15. A method in accordance with claim 4 wherein:

a portion of the multiple layers is not exposed to either electron beams.

16. A method in accordance with claim 4 wherein:

the electron beams of energy levels respectively lightly expose the first and second photoresist layers.

17. A method in accordance with claim 5 wherein:

a portion of the multiple layers is not exposed to either electron beams.

18. A method in accordance with claim 5 wherein:

the electron beams of energy levels respectively lightly expose the first and second photoresist layers.

19. A method in accordance with claim 6 wherein:

a portion of the multiple layers is not exposed to either electron beams.

20. A method in accordance with claim 6 wherein:

the electron beams of energy levels respectively lightly expose the first and second photoresist layers.

21. A method in accordance with claim 7 wherein:

a portion of the multiple layers is not exposed to either electron beams.

22. A method in accordance with claim 7 wherein:

the electron beams of energy levels respectively lightly expose the first and second photoresist layers.

23. A method in accordance with claim 8 wherein:

a portion of the multiple layers is not exposed to either electron beams.

24. A method in accordance with claim 8 wherein:

the electron beams of energy levels respectively lightly expose the first and second photoresist layers.

* * * * *